United States Patent
Ko et al.

(10) Patent No.: US 9,231,000 B2
(45) Date of Patent: Jan. 5, 2016

(54) THIN FILM TRANSISTOR ARRAY SUBSTRATE AND ORGANIC LIGHT-EMITTING DISPLAY APPARATUS INCLUDING THE SAME

(71) Applicant: SAMSUNG DISPLAY CO., LTD., Yongin, Gyeonggi (KR)

(72) Inventors: Moon-Soon Ko, Yongin (KR); Il-Jung Lee, Yongin (KR); Choong-Youl Im, Yongin (KR); Do-Hyun Kwon, Yongin (KR); Ju-Won Yoon, Yongin (KR); Min-Woo Woo, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 89 days.

(21) Appl. No.: 13/961,823

(22) Filed: Aug. 7, 2013

(65) Prior Publication Data
US 2014/0239270 A1    Aug. 28, 2014

(30) Foreign Application Priority Data

Feb. 28, 2013 (KR) .......................... 10-2013-0022444

(51) Int. Cl.
| | |
|---|---|
| H01L 29/08 | (2006.01) |
| H01L 35/24 | (2006.01) |
| H01L 51/00 | (2006.01) |
| H01L 27/12 | (2006.01) |
| H01L 27/32 | (2006.01) |

(52) U.S. Cl.
CPC ........ H01L 27/1255 (2013.01); H01L 27/3265 (2013.01); H01L 27/3276 (2013.01); *H01L 27/1237* (2013.01)

(58) Field of Classification Search
USPC .......................... 257/40, 71, 59, 72; 438/158
See application file for complete search history.

(56) References Cited

U.S. PATENT DOCUMENTS

| | | | |
|---|---|---|---|
| 2004/0183083 A1 | 9/2004 | Koo | |
| 2005/0057460 A1 | 3/2005 | Lee et al. | |
| 2009/0128018 A1* | 5/2009 | Lee | ............... 313/504 |
| 2011/0102402 A1 | 5/2011 | Han | |
| 2014/0132584 A1* | 5/2014 | Kim | ............... 345/212 |

FOREIGN PATENT DOCUMENTS

| | | |
|---|---|---|
| KR | 10-0521277 | 10/2005 |
| KR | 10-0560782 | 3/2006 |
| KR | 10-1082300 | 11/2011 |

* cited by examiner

*Primary Examiner* — Telly Green
(74) *Attorney, Agent, or Firm* — Christie, Parker & Hale, LLP

(57) ABSTRACT

A thin film transistor array substrate includes a plurality of pixels, each of the pixels including a capacitor comprising a first electrode, and a second electrode located above the first electrode, a data line extending in a first direction, configured to provide a data signal, located above the capacitor, and overlapping a part of the capacitor, and a driving voltage line configured to supply a driving voltage, located between the capacitor and the data line, and comprising a first line extending in the first direction, and a second line extending in a second direction substantially perpendicular to the first direction.

20 Claims, 5 Drawing Sheets

THIN FILM TRANSISTOR ARRAY SUBSTRATE AND ORGANIC LIGHT-EMITTING DISPLAY APPARATUS INCLUDING THE SAME

CROSS-REFERENCE TO RELATED APPLICATION

This application claims priority to and the benefit of Korean Patent Application No. 10-2013-0022444, filed on Feb. 28, 2013, in the Korean Intellectual Property Office, the disclosure of which is incorporated herein in its entirety by reference.

BACKGROUND

1. Field

Embodiments of the present invention relate to a thin film transistor array substrate and an organic light-emitting display apparatus including the same.

2. Description of the Related Art

An organic light-emitting display apparatus is self-emissive, and unlike a liquid crystal display apparatus, the organic light-emitting display apparatus does not require a separate light source, such as a backlight, thereby having comparatively reduced thickness and weight. Also, the organic light-emitting display apparatus has excellent characteristics including low power consumption, high brightness, a quick response time, or the like.

The organic light-emitting display apparatus includes gate lines that are located on a substrate and that extend in one direction, data lines that extend to cross the gate lines, a pixel circuit that is electrically connected to each of the gate lines and each of the data lines, and an organic light emitting diode (OLED) that is electrically connected to the pixel circuit. However, recently, the organic light-emitting display apparatus is required to have high definition, such that available space for the pixel circuit is decreased.

SUMMARY

Embodiments of the present invention provide a thin film transistor array substrate and an organic light-emitting display apparatus including the same, whereby crosstalk due to coupling between a data line and a capacitor may be reduced or prevented, and a driving voltage line may be designed to have a mesh structure.

According to an aspect of embodiments of the present invention, there is provided a thin film transistor array substrate including a plurality of pixels, each of the pixels including a capacitor comprising a first electrode, and a second electrode located above the first electrode, a data line extending in a first direction, configured to provide a data signal, located above the capacitor, and overlapping a part of the capacitor, and a driving voltage line configured to supply a driving voltage, located between the capacitor and the data line, and comprising a first line extending in the first direction, and a second line extending in a second direction substantially perpendicular to the first direction.

The second electrode of the capacitor may be electrically coupled to the driving voltage line via a contact hole.

The driving voltage line may have a mesh structure.

The first line of the driving voltage line may be coupled to ones of the pixels that are adjacent each other in the first direction, and the second line of the driving voltage line may be coupled to ones of the pixels that are adjacent each other in the second direction.

The second line of the driving voltage line may completely cover the capacitor.

The thin film transistor array substrate may further include a first interlayer insulating layer and a second interlayer insulating layer stacked between the capacitor and the driving voltage line, and a third interlayer insulating layer between the driving voltage line and the data line.

Each of the plurality of pixels may further include a driving thin film transistor (TFT) electrically coupled between the driving voltage line and a light-emitting device, and a switching TFT electrically coupled between the data line and the driving TFT.

The driving TFT may include a semiconductor layer, a gate electrode coupled to the first electrode of the capacitor and located above the semiconductor layer at a same layer as the second electrode of the capacitor, a source electrode electrically coupled to the driving voltage line, and a drain electrode electrically coupled to the light-emitting device.

The switching TFT may include a semiconductor layer, a gate electrode located above the semiconductor layer at a same layer as the first electrode of the capacitor, and coupled to a first scan line extending in the second direction, a source electrode coupled to the data line, and a drain electrode coupled to the driving TFT.

Each of the plurality of pixels may further include a first scan line, a second scan line, and an emission control line extending in the second direction at a same layer as the first electrode of the capacitor, and an initialization voltage line extending in the second direction between the driving voltage line and the second electrode of the capacitor.

According to another aspect of embodiments of the present invention, there is provided an organic light-emitting display apparatus including a plurality of pixels each including a first thin film transistor (TFT) on a substrate and including a gate electrode, a second TFT on the substrate and including a gate electrode, a capacitor including a first electrode at a same layer as the gate electrode of the second TFT, and a second electrode above the first electrode and at a same layer as the gate electrode of the first TFT, a data line configured to provide a data signal and located above, and overlapping a part of, the capacitor, the data line extending in a first direction, and a driving voltage line located between the capacitor and the data line and configured to supply a driving voltage, the driving voltage line comprising a first line extending in the first direction, and a second line extending in a second direction substantially perpendicular to the first direction.

The second electrode of the capacitor may be electrically coupled to the driving voltage line via a contact hole.

The driving voltage line may have a mesh structure.

The first line of the driving voltage line may be coupled to ones of the pixels that are adjacent each other in the first direction, and the second line of the driving voltage line may be coupled to ones of the pixels that are adjacent each other in the second direction.

The second line of the driving voltage line may completely cover the capacitor.

The organic light-emitting display apparatus may further include a first interlayer insulating layer and a second interlayer insulating layer stacked between the capacitor and the driving voltage line, and a third interlayer insulating layer between the driving voltage line and the data line.

The first TFT may be electrically coupled between the driving voltage line and a light-emitting device, and the second TFT may be coupled between the data line and the first TFT.

The first TFT may further include a semiconductor layer, a source electrode electrically coupled to the driving voltage line, and a drain electrode electrically coupled to the light-emitting device, and the gate electrode of the first TFT may be located above the semiconductor layer at a same layer as the second electrode of the capacitor, and may be coupled to the first electrode of the capacitor.

The second TFT may further include a semiconductor layer, a source electrode coupled to the data line, and a drain electrode coupled to the first TFT, and the gate electrode of the second TFT may be located above the semiconductor layer at the same layer as the first electrode of the capacitor, and may be coupled to a first scan line that extends in the second direction.

Each of the plurality of pixels may further include a first scan line, a second scan line, and an emission control line extending in the second direction and located at the same layer as the first electrode of the capacitor, and an initialization voltage line extending in the second direction and located between the second electrode of the capacitor and the driving voltage line.

BRIEF DESCRIPTION OF THE DRAWINGS

The above and other aspects of the present invention will become more apparent by describing in detail exemplary embodiments thereof with reference to the attached drawings, in which.

DETAILED DESCRIPTION

Figure 1:
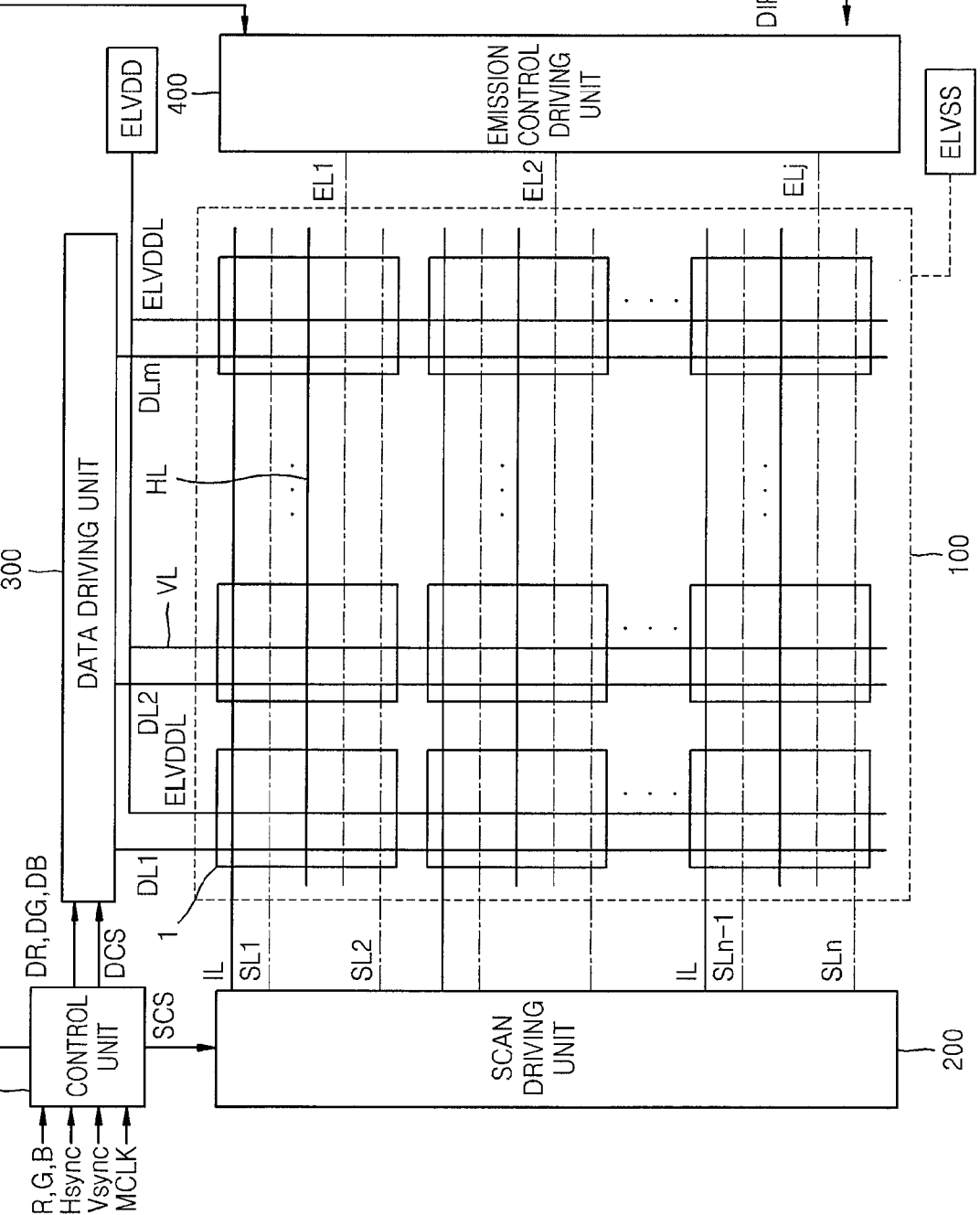
FIG. 1 is a block diagram of a display apparatus according to an embodiment of the present invention.

Hereinafter, embodiments of the present invention will be described in detail by explaining exemplary embodiments of the invention with reference to the attached drawings. The invention may, however, be embodied in many different forms, and should not be construed as being limited to the embodiments set forth herein; rather, these embodiments are provided so that this disclosure will be thorough and complete, and will fully convey the concept of the invention to those skilled in the art In the following description, well-known functions or constructions are not described in detail to avoid obscuring the invention with unnecessary detail. Like reference numerals in the drawings denote like or similar elements throughout the specification.

Also, thicknesses and sizes of elements in the drawings may be arbitrarily shown for convenience of description, thus, the spirit and scope of the present invention are not necessarily defined by the drawings.

In the drawings, the thicknesses of layers and regions may be exaggerated for clarity. Throughout the specification, it will also be understood that when an element such as layer, region, or substrate is referred to as being "on" another element, it can be directly on the other element, or one or more intervening elements may also be present.

Also, when a part "includes" or "comprises" an element, unless there is a particular description contrary thereto, the part can further/additionally include other elements. In addition, throughout the specification, it will also be understood that when an element is referred to as being "above" a target element, it means that the element can be above or below the target element, and does not necessarily mean that the element is above the target element in a gravitational direction.

As used herein, the term "and/or" includes any and all combinations of one or more of the associated listed items.

FIG. 1 is a block diagram of a display apparatus 100 according to an embodiment of the present invention.

In the present embodiment, the display apparatus 10 includes a display unit 100 including a plurality of pixels 1, a scan driving unit 200, a data driving unit 300, an emission control driving unit 400, and a control unit 500.

The display unit 100 includes the plurality of pixels 1 that are respectively at cross points/crossing regions of respective ones of a plurality of scan lines SL1 through SLn, a plurality of data lines DL1 through DLm, and a plurality of control emission lines EL1 through ELn and that are arrayed in a matrix. The plurality of scan lines SL1 through SLn and the plurality of control emission lines EL1 through ELn extend in a second direction that is a row direction, and the plurality of data lines DL1 through DLm extend in a first direction that is a column direction. Driving voltage lines ELVDDL have a mesh structure including vertical lines VL that extend in the first direction and horizontal lines HL that extend in the second direction. At one pixel line, an n value of the plurality of scan lines SL1 through SLn may be different from an n value of the plurality of control emission lines EL1 through ELn.

Each of the pixels 1 is connected to two scan lines from among the plurality of scan lines SL1 through SLn that are connected to the display unit 100. The scan driving unit 200 generates and transmits two scan signals to each of the pixels 1 via the plurality of scan lines SL1 through SLn. That is, the scan driving unit 200 sequentially supplies scan signals to first scan lines (e.g., even scan lines) SL2 through SLn or second scan lines (e.g., odd scan lines) SL1 through SLn−1. Referring to FIG. 1, at each pixel 1, two scan lines are connected to a corresponding pixel line, although the present invention is not limited to thereto, and thus, in another embodiment of the present invention, each pixel 1 may be connected to one scan line of a corresponding pixel line and another scan line of a previous pixel line.

In the present embodiment, an initialization voltage line IL is electrically connected to the scan driving unit 200, and may thus receive an initialization voltage from the scan driving unit 200. However, in another embodiment of the present invention, the initialization voltage line IL may receive an initialization voltage from an external voltage supply source.

Also, each pixel 1 is electrically connected to one data line from among the plurality of data lines DL1 through DLm that are connected to the display unit 10, and is electrically connected to one control emission line from among the plurality of control emission lines EL1 through ELn that are connected to the display unit 100.

The data driving unit 300 transmits a data signal to each pixel 1 via a respective one of the plurality of data lines DL1 through DLm. Whenever a scan signal is supplied via the first scan lines SL2 through SLn, the data signal is supplied to a corresponding pixel 1 that is selected in response to the scan signal.

The emission control driving unit 400 generates and transmits an emission control signal to each pixel 1 via a respective one of the plurality of control emission lines EL1 through ELn. The emission control signal controls an emission time of each pixel 1. In other embodiments of the present invention, the emission control driving unit 400 may be omitted according to an inner structure of each pixel 1.

The control unit 500 converts a plurality of image signals R, G, and B from an external source into a plurality of image data signals DR, DG, and DB, and transmits the plurality of image data signals DR, DG, and DB to the data driving unit 300. Also, the control unit 500 generates control signals to control driving of the scan driving unit 200, the data driving unit 300, and the emission control driving unit 400, in response to receiving a vertical synchronization signal Vsync, a horizontal synchronization signal Hsync, and a clock signal MCLK, and then transmits the control signals to the scan driving unit 200, the data driving unit 300, and the emission control driving unit 400, respectively. That is, the control unit 500 generates and transmits a scan driving control signal SCS for controlling the scan driving unit 200, a data driving control signal DCS for controlling the data driving unit 300, and an emission driving control signal ECS for controlling the emission control driving unit 400.

Each of the pixels 1 receives a first power voltage ELVDD and a second power voltage ELVSS from an external source. The first power voltage ELVDD may be a high-level voltage (e.g., a predetermined high-level voltage), and the second power voltage ELVSS may be lower than the first power voltage ELVDD, or may be a ground voltage. The first power voltage ELVDD is supplied to the pixels 1 via respective ones of the driving voltage lines ELVDDL.

The pixels 1 emit light (e.g., light having a predetermined brightness) due to a driving current that is supplied to emission devices in response to data signals supplied via respective ones of the plurality of data lines DL1 through DLm.

Figure 2:
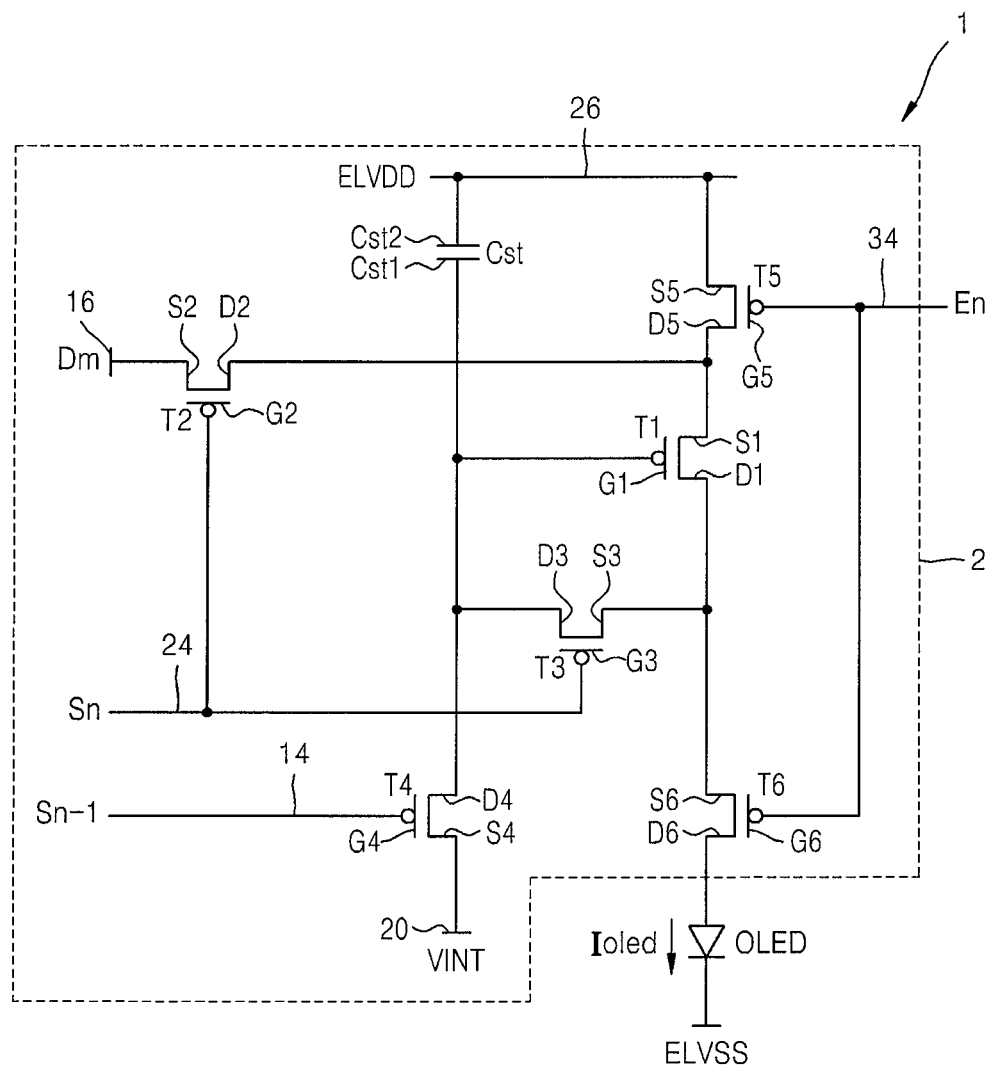
FIG. 2 is a circuit diagram of one pixel of the display apparatus, according to an embodiment of the present invention.

FIG. 2 is a circuit diagram of one pixel 1 of the display apparatus 10, according to an embodiment of the present invention.

In the present embodiment, the pixel 1 of the display apparatus 10 has a pixel circuit 2 that includes a plurality of thin film transistors (TFTs) T1 through T6 and a storage capacitor Cst. The pixel 1 includes an organic light-emitting diode (OLED) that receives a driving current (e.g., Ioled) from the pixel circuit 2, and thus emits light.

The TFTs T1 through T6 respectively include a driving TFT T1, a switching TFT T2, a compensation TFT T3, an initialization TFT T4, a first emission control TFT T5, and a second emission control TFT T6.

The pixel 1 includes a first scan line 24 that transmits a first scan signal Sn to the switching TFT T2 and the compensation TFT T3; a second scan line 14 that transmits a second scan signal Sn−1 to the initialization TFT T4; an emission control line 34 that transmits an emission control signal En to the first emission control TFT T5 and the second emission control TFT T6; a data line 16 that crosses the first scan line 24 and that transmits a data signal Dm; a driving voltage line 26 that transmits a first power voltage ELVDD; and an initialization voltage line 20 that transmits an initialization voltage VINT for initializing the driving TFT T1.

A gate electrode G1 of the driving TFT T1 is connected to a first electrode Cst1 of the storage capacitor Cst. A source electrode S1 of the driving TFT T1 is electrically connected to the driving voltage line 26 via the first emission control TFT T5. A drain electrode D1 of the driving TFT T1 is electrically connected to an anode electrode of the OLED via the second emission control TFT T6. The driving TFT T1 receives the data signal Dm according to a switching operation by the switching TFT T2, and then supplies a driving current Ioled to the OLED.

A gate electrode G2 of the switching TFT T2 is connected to the first scan line 24. A source electrode S2 of the switching TFT T2 is connected to the data line 16. A drain electrode D2 of the switching TFT T2 is connected to the source electrode S1 of the driving TFT T1 and is electrically connected to the driving voltage line 26 via the first emission control TFT T5. The switching TFT T2 is turned on in response to the first scan signal Sn that is transmitted via the first scan line 24, and thus performs a switching operation for transmitting the data signal Dm via the data line 16 to the source electrode S1 of the driving TFT T1.

A gate electrode G3 of the compensation TFT T3 is connected to the first scan line 24. A source electrode S3 of the compensation TFT T3 is connected to the drain electrode D1 of the driving TFT T1 and is electrically connected to the anode electrode of the OLED via the second emission control TFT T6. A drain electrode D3 of the compensation TFT T3 is connected to the first electrode Cst1 of the storage capacitor Cst, to a drain electrode D4 of the initialization TFT T4, and to the gate electrode G1 of the driving TFT T1. The compensation TFT T3 is turned on in response to the first scan signal Sn that is transmitted via the first scan line 24, and thus diode-connects the driving TFT T1 by electrically connecting the gate electrode G1 of the driving TFT T1 to the drain electrode D1 of the driving TFT T1.

A gate electrode G4 of the initialization TFT T4 is connected to the second scan line 14. A source electrode S4 of the initialization TFT T4 is connected to the initialization voltage line 20. The drain electrode D4 of the initialization TFT T4 is connected to the first electrode Cst1 of the storage capacitor Cst, to the drain electrode D3 of the compensation TFT T3, and to the gate electrode G1 of the driving TFT T1. The initialization TFT T4 is turned on in response to the second scan signal Sn−1 that is transmitted via the second scan line 14, and thus performs an initialization operation for initializing a voltage of the gate electrode G1 of the driving TFT T1 by transmitting the initialization voltage VINT to the gate electrode G1 of the driving TFT T1.

A gate electrode G5 of the first emission control TFT T5 is connected to the emission control line 34. A source electrode S5 of the first emission control TFT T5 is connected to the driving voltage line 26. A drain electrode D5 of the first emission control TFT T5 is connected to the source electrode S1 of the driving TFT T1 and the drain electrode D2 of the switching TFT T2.

A gate electrode G6 of the second emission control TFT T6 is connected to the emission control line 34. A source electrode S6 of the second emission control TFT T6 is connected to the drain electrode D1 of the driving TFT T1 and the source electrode S3 of the compensation TFT T3. A drain electrode D6 of the second emission control TFT T6 is electrically connected to the anode electrode of the OLED. The first emission control TFT T5 and the second emission control TFT T6 are simultaneously turned on in response to an emission control signal En that is transmitted via the emission control line 34, so that the first power voltage ELVDD is supplied to the OLED, and thus the driving current Ioled flows in the OLED.

A second electrode Cst2 of the storage capacitor Cst is connected to the driving voltage line 26. The first electrode Cst1 of the storage capacitor Cst is connected to the gate electrode G1 of the driving TFT T1, to the drain electrode D3 of the compensation TFT T3, and to the drain electrode D4 of the initialization TFT T4.

A cathode electrode of the OLED is connected to the second power voltage ELVSS. The OLED receives the driving current Ioled from the driving TFT T1 and then emits light, so that an image is displayed.

Figure 3:
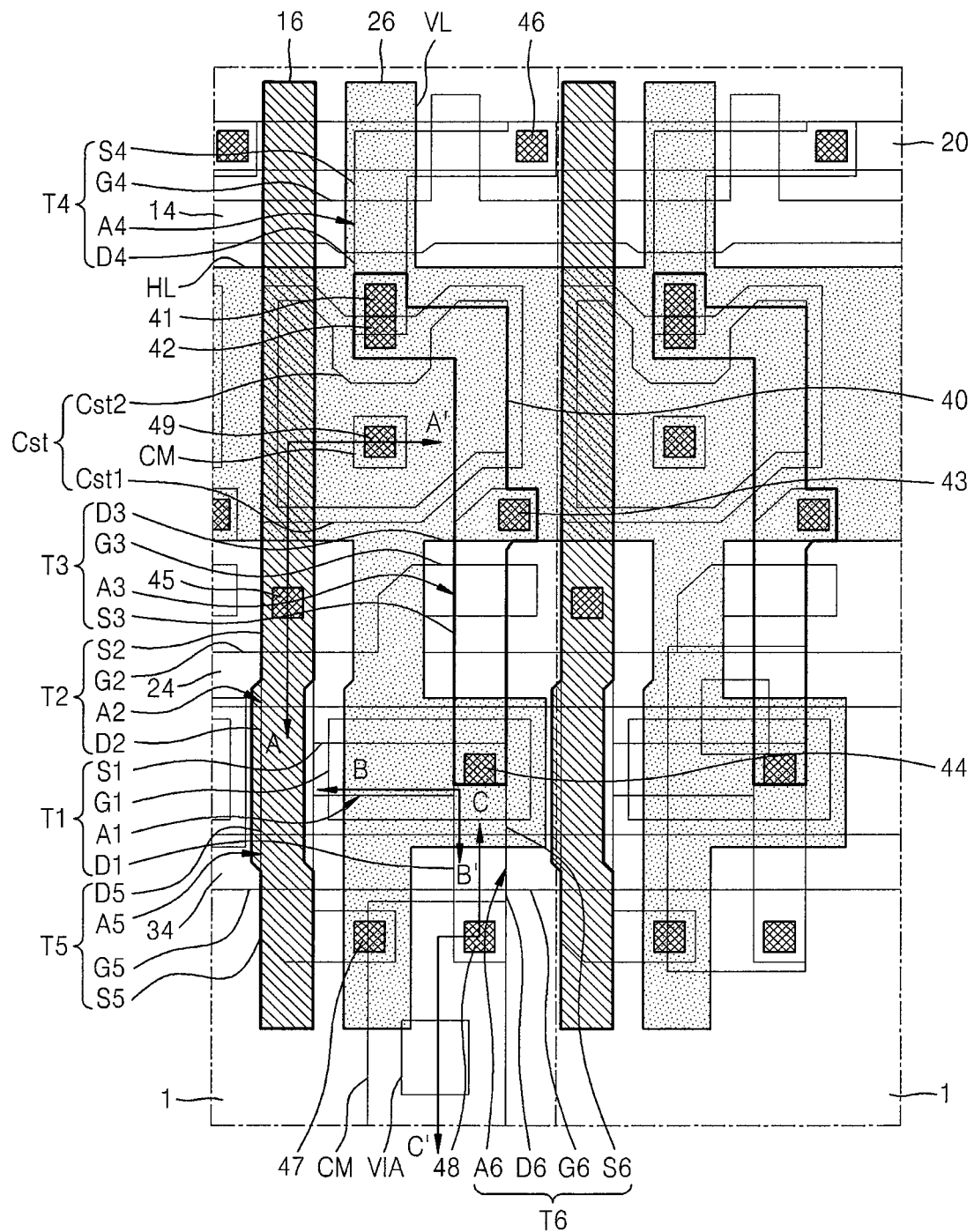
FIG. 3 is a plane view illustrating the pixel of FIG. 2, according to an embodiment of the present invention.
Figure 4:
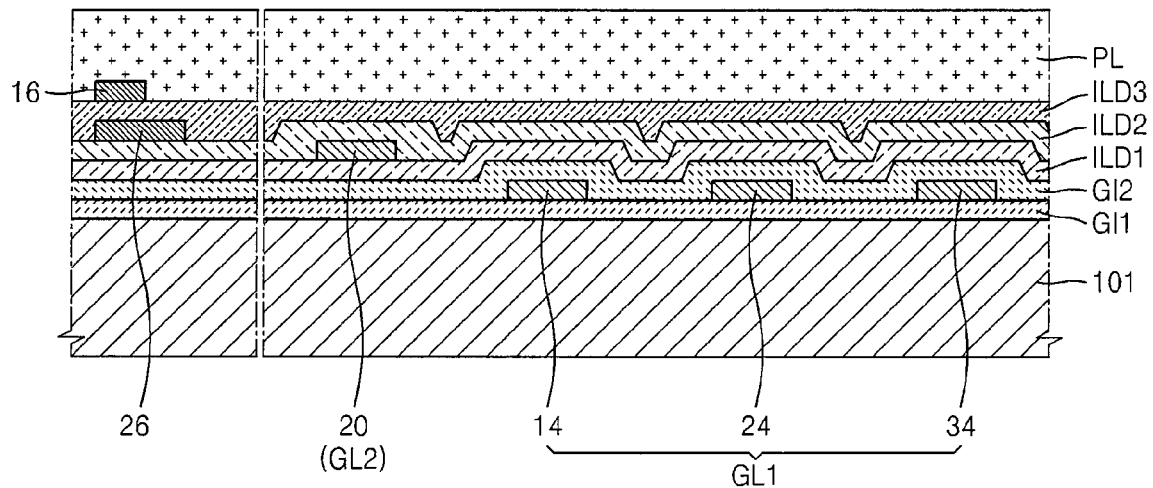
FIG. 4 is a cross-sectional view illustrating signal lines shown in FIG. 3.

FIG. 3 is a plane view illustrating the pixel 1 of FIG. 2, according to an embodiment of the present invention. FIG. 4 is a cross-sectional view illustrating signal lines shown in FIG. 3. Here, FIG. 3 illustrates two pixels 1 that are adjacent each other.

As illustrated in FIG. 3, the pixel 1 of the display apparatus 10 includes a first scan line 24, a second scan line 14, an emission control line 34, and an initialization voltage line 20 that are formed in a second direction and that respectively apply a first scan signal Sn, a second scan signal Sn−1, an emission control signal En, and an initialization voltage VINT. Also, the pixel 1 of the display apparatus 100 includes a data line 16 that is formed in a first direction and crosses all of the first scan line 24, the second scan line 14, the emission control line 34, and the initialization voltage line 20, and that applies a data signal Dm to the pixel 1. In addition, the pixel 1 includes a driving voltage line 26 that applies a first power voltage ELVDD.

The driving voltage line 26 includes a vertical line VL that is formed in the first direction so as to be substantially parallel to the data line 16, and a horizontal line HL that is formed in the second direction so as to be substantially perpendicular to the data line 16. The vertical line VL of the driving voltage line 26 is electrically connected with other vertical lines VL of other pixels that are adjacent in the first direction, and the horizontal line HL is electrically connected with other horizontal lines HL of other pixels that are adjacent in the second direction, and crosses the data line 16, so that the vertical lines VL and the horizontal lines HL have a mesh structure. The driving voltage line 26 is located at a layer between the storage capacitor Cst and the data line 16, thereby functioning as a metal shield. Also, the horizontal line HL of the driving voltage line 26 has an area that completely covers the storage capacitor Cst, and thus completely overlaps with the storage capacitor Cst.

Referring to FIG. 4, the first scan line 24, the second scan line 14, and the emission control line 34 are formed on a first gate insulating layer GI1 on a substrate 101, and are included in a first gate wiring GL1. The initialization voltage line 20 is formed above a first interlayer insulating layer ILD1 and a second gate insulating layer GI2 that is located on the first gate insulating layer GI1. The initialization voltage line 20 is included in a second gate wiring GL2. Since the first gate wiring GL1 and the second gate wiring GL2 are located at different layers by having the second gate insulating layer GI2 and the first interlayer insulating layer ILD1 interposed therebetween, a distance between the neighbouring first and second gate wirings GL1 and GL2 that are located at the different layers may be decreased, so that more pixels 1 may be formed in a same region. That is, it is possible to form the display apparatus 10 to have high definition.

A second interlayer insulating layer ILD2 is stacked/layered on/above the first gate wiring GL1 and the second gate wiring GL2.

The driving voltage line 26 is located on the second interlayer insulating layer ILD2, and the data line 16 is located on a third interlayer insulating layer ILD3 that is on the second interlayer insulating layer ILD2 and partially overlaps the driving voltage line 26. A protective layer PL is formed on the data line 16.

Referring back to FIG. 3, the pixel 1 includes a driving TFT T1, a switching TFT T2, a compensation TFT T3, an initialization TFT T4, a first emission control TFT T5, and a second emission control TFT T6. In FIG. 3, an OLED is omitted.

The driving TFT T1 includes a semiconductor layer A1, a gate electrode G1, a source electrode S1, and a drain electrode D1. The source electrode S1 corresponds to a source region of the driving semiconductor layer A1 that is doped with impurities, and the drain electrode D1 corresponds to a drain region of the semiconductor layer A1 that is doped with impurities. The gate electrode G1 is connected to a first electrode Cst1 of the storage capacitor Cst, a drain electrode D3 of the compensation TFT T3, and a drain electrode D4 of the initialization TFT T4 via a connection member 40 and contact holes 41 through 44. A projection portion that projects from the vertical line VL of the driving voltage line 26 is located on the gate electrode G1 of the driving TFT T1.

The switching TFT T2 includes a semiconductor layer A2, a gate electrode G2, a source electrode S2, and a drain electrode D2. The source electrode S2 corresponds to a source region of the semiconductor layer A2 that is doped with impurities, and the drain electrode D2 corresponds to a drain region of the semiconductor layer A2 that is doped with impurities. The source electrode S2 is connected to the data line 16 via a contact hole 45. The gate electrode G2 is formed as a part of the first scan line 24.

The compensation TFT T3 includes a semiconductor layer A3, a gate electrode G3, a source electrode S3, and the drain electrode D3. The source electrode S3 corresponds to a source region of the semiconductor layer A3 that is doped with impurities, and the drain electrode D3 corresponds to a drain region of the semiconductor layer A3 that is doped with impurities. The gate electrode G3 is formed as dual gate electrodes by a part of the first scan line 24 and a part of a line that extends while projecting from the first scan line 24, so that the gate electrode G3 prevents a leakage current.

The initialization TFT T4 includes a semiconductor layer A4, a gate electrode G4, a source electrode S4, and the drain electrode D4. The source electrode S4 corresponds to a source region of the semiconductor layer A4 that is doped with impurities, and the drain electrode D4 corresponds to a drain region of the semiconductor layer A4 that is doped with impurities. The source electrode S4 may be connected to the initialization voltage line 20 via a contact hole 46. The gate electrode G4 is formed as a part of the second scan line 14.

The first emission control TFT T5 includes a semiconductor layer A5, a gate electrode G5, a source electrode S5, and a drain electrode D5. The source electrode S5 corresponds to a source region of the semiconductor layer A5 that is doped with impurities, and the I drain electrode D5 corresponds to a drain region of the semiconductor layer A5 that is doped with impurities. The source electrode S5 may be connected to the driving voltage line 26 via a contact hole 47. The gate electrode G5 is formed as a part of the emission control line 34.

The second emission control TFT T6 includes a semiconductor layer A6, a gate electrode G6, a source electrode S6, and a drain electrode D6. The source electrode S6 corresponds to a source region of the semiconductor layer A6 that is doped with impurities, and the drain electrode D6 corresponds to a drain region of the semiconductor layer A6 that is doped with impurities. The drain electrode D6 is connected to an anode electrode of the OLED via a contact metal CM through a contact hole 48 and then a via hole VIA through the contact metal CM. The gate electrode G6 is formed as a part of the emission control line 34.

The first electrode Cst1 of the storage capacitor Cst is connected to the drain electrode D3 of the compensation TFT T3, to the drain electrode D4 of the initialization TFT T4, and to the gate electrode G1 of the driving TFT T1 by using the connection member 40.

A second electrode Cst2 of the storage capacitor Cst is connected to the driving voltage line 26 by using a contact metal CM formed in a contact hole 49, and thus receives a driving voltage ELVDD from the driving voltage line 26.

Figure 5:
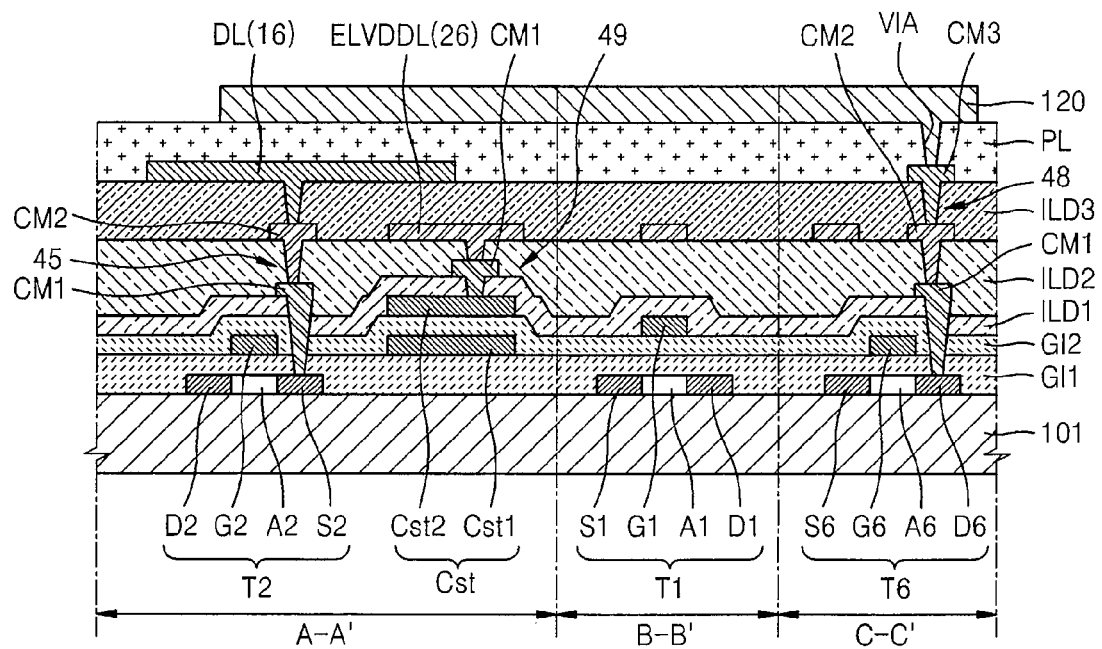
FIG. 5 is a cross-sectional view of the structure of FIG. 3, taken along the lines A-A', B-B', and C-C', according to an embodiment of the present invention.

FIG. 5 is a cross-sectional view of the structure of FIG. 3, taken along the lines A-A', B-B', and C-C', according to an embodiment of the present invention. Of those among the TFTs T1 through T6, FIG. 5 illustrates the driving TFT T1, the switching TFT T2, and the second emission control TFT T6, and the storage capacitor Cst.

Referring to FIG. 5, the semiconductor layer A1 of the driving TFT T1, the semiconductor layer A2 of the switching TFT T2, and the semiconductor layer A6 of the second emission control TFT T6 are formed on the substrate 101. The aforementioned semiconductor layers A1, A2, and A6 may be formed of polysilicon, and include a channel region that is not doped with impurities, and a source region and a drain region that are formed at sides of the channel region and that are doped with impurities. Here, the impurities vary according to types of a TFT, and may include N-type impurities or P-type impurities. Although not illustrated, the semiconductor layer A3 of the compensation TFT T3, the semiconductor layer A4 of the initialization TFT T4, and the semiconductor layer A5 of the first emission control TFT T5 may be formed with the semiconductor layer A1, the semiconductor layer A2, and the semiconductor layer A6 (e.g., A1, A2 and A6 may be formed simultaneously as, or may be formed at about the same time as, A3, A4, and A5).

Although not illustrated, a buffer layer may be further formed between the substrate 101 and the semiconductor layers A1 through A6. The buffer layer reduces or prevents diffusion of impurity ions and penetration of external moisture or air, and functions as a barrier layer and/or a blocking layer to planarize a surface.

The first gate insulating layer GI1 is stacked on the semiconductor layers A1 through A6, and is above an entire surface of the substrate 101. The first gate insulating layer GI1 may be formed of an organic insulating material or an inorganic insulating material, or may have a multi-stack structure of alternately formed organic insulating material and the inorganic insulating material.

The gate electrode G2 of the switching TFT T2, and the gate electrode G6 of the second emission control TFT T6 are formed on the first gate insulating layer GI1. Also, the first electrode Cst1 of the storage capacitor Cst is formed. Although not illustrated, the gate electrode G3 of the compensation TFT T3, the gate electrode G4 of the initialization TFT T4, and the gate electrode G5 of the first emission control TFT T5 may be formed at the same layer as the gate electrode G2 and the gate electrode G6, and may be of the same material as well. The gate electrode G2, the gate electrode G3, the gate electrode G4, the gate electrode G5, the gate electrode G6, and the first electrode Cst1 of the storage capacitor Cst are formed of a first gate wiring material, and hereinafter, they are referred to as first gate electrodes. The first gate wiring material may include, for example, one or more metal materials selected from the group consisting of aluminium (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The first scan line 24, the second scan line 14, and the emission control line 34 may be formed from the same layer as the first gate electrodes by using the first gate wiring material.

The second gate insulating layer GI2 is stacked on the first gate electrodes and is located above the entire surface of the substrate 101. The second gate insulating layer GI2 may be formed of an organic insulating material, may be formed of an inorganic insulating material, or may have a multi-stack structure in which organic insulating material and inorganic insulating material are alternately formed.

The gate electrode G1 of the driving TFT T1 is formed on the second gate insulating layer GI2. Also, the second electrode Cst2 of the storage capacitor Cst is formed on the second gate insulating layer GI2. The gate electrode G1, and the second electrode Cst2 of the storage capacitor Cst are formed of a second gate wiring material, and hereinafter, they are referred to as second gate electrodes. Similarly, as the first gate wiring material, the second gate wiring material may include, for example, one or more metal materials selected from the group consisting of Al, Pt, Pd, Ag, Mg, Au, Ni, Nd, Ir, Cr, Li, Ca, Mo, Ti, W, and Cu.

The first interlayer insulating layer ILD1 is stacked on the second gate electrodes and is located above the entire surface of the substrate 101. The first interlayer insulating layer ILD1 may be formed of an organic insulating material, may be formed of an inorganic insulating material, or may have a multi-stack structure in which layers of organic insulating material and inorganic insulating material are alternately formed.

A first contact metal CM1 is formed at each of the contact holes 45, 48, and 49 in the first interlayer insulating layer ILD1, and thus is connected to the second electrode Cst2 of the storage capacitor Cst, to the source electrode S2 of the switching TFT T2, and to the drain electrode D6 of the second emission control TFT T6. The first contact metal CM1 may include, for example, one or more metal materials selected from the group consisting of Al, Pt, Pd, Ag, Mg, Au, Ni, Nd, Ir, Cr, Li, Ca, Mo, Ti, W, and Cu. The first contact metal CM1 may include a multi-stack metal layer, and in the present embodiment, the first contact metal CM1 has a three-layer structure of Ti/Al/Ti in which titanium is formed above and below Al. However, the one or more embodiments of the present invention are not limited thereto, and thus the first contact metal CM1 may be a multi-stack layer formed of various materials. Further, the initialization voltage line 20 may include the material of the first contact metal CM1 and may be formed on the first interlayer insulating layer ILD1.

The second interlayer insulating layer ILD2 is stacked on the first contact metal CM1 and is located above the entire surface of the substrate 101. The second interlayer insulating layer ILD2 may be formed of an organic insulating material or of an inorganic insulating material, or may have a multi-stack structure in which alternating layers of organic insulating material and inorganic insulating material are formed.

The driving voltage line 26 is formed on the second interlayer insulating layer ILD2 and is connected to the second electrode Cst2 of the storage capacitor Cst via the first contact metal CM1. Also, a second contact metal CM2 is formed at each of the contact holes 45 and 48 in the second interlayer insulating layer ILD2, and thus is connected to the source electrode S2 of the switching TFT T2 and to the drain electrode D6 of the second emission control TFT T6. The driving voltage line 26 and the second contact metal CM2 may include, for example, one or more metal materials selected from the group consisting of Al, Pt, Pd, Ag, Mg, Au, Ni, Nd, Ir, Cr, Li, Ca, Mo, Ti, W, and Cu.

The second contact metal CM2 may include a multi-stack metal layer, and in the present embodiment, the second contact metal CM2 has a three-layer structure of Ti/Al/Ti in which titanium is formed above and below Al. However, the one or more embodiments of the present invention are not limited thereto and thus the second contact metal CM2 may have a multi-stack layer formed of various materials.

The third interlayer insulating layer ILD3 is formed on the driving voltage line 26 and on the second contact metal CM2, and is located above the entire surface of the substrate 101. The third interlayer insulating layer ILD3 may be formed of an organic insulating material, of an inorganic insulating material, or may have a multi-stack structure in which an organic insulating material is alternately formed with an inorganic insulating material.

The data line 16 is formed on the third interlayer insulating layer ILD3. The data line 16 is connected to the source electrode S2 of the switching TFT T2 via the first contact metal CM1 and the second contact metal CM2 in the contact hole 45 in the first and second interlayer insulating layers ILD1 and ILD2. A part of the storage capacitor Cst overlaps with the data line 16, and the driving voltage line 26 is formed at a region corresponding to where the data line 16 and the storage capacitor Cst overlap. Also, a third contact metal CM3 is formed in the contact hole 48 in the third interlayer insulating layer ILD3, and thus is electrically connected to the drain electrode D6 of the second emission control TFT T6. The data line 16 and the third contact metal CM3 may include, for example, one or more metal materials selected from the group consisting of Al, Pt, Pd, Ag, Mg, Au, Ni, Nd, Ir, Cr, Li, Ca, Mo, Ti, W, and Cu. The third contact metal CM3 may include a multi-stack metal layer, and in the present embodiment, the third contact metal CM3 has a three-layer structure of Ti/Al/Ti in which titanium is formed above and below Al. However, the one or more embodiments of the present invention are not limited thereto and thus the third contact metal CM3 of other embodiments of the present invention may have a multi-stack layer formed of various materials.

A planarization layer PL is formed on the data line 16 and the third contact metal CM3. The planarization layer PL may be formed to planarize a surface above the substrate 101 on which the TFTs T1 through T6 are formed, and may be formed as a single insulating layer or as a multi-stack insulating layer. The planarization layer PL may include, for example, one or more materials selected from the group consisting of polyimide, polyamide, acryl resin, benzocyclobutene (BCB), and phenol resin.

An anode electrode 120 is formed on the planarization layer PL. The anode electrode 120 is connected to the third contact metal CM3 located in the contact hole 48 via a via hole VIA in the planarization layer PL, and thus is electrically connected to the drain electrode D6 of the second emission control TFT T6.

In FIG. 5, source and drain electrodes among those of the TFTs T1 through T6 that are not connected to other lines are formed from the same layers as the semiconductor layers A1 through A6, respectively. That is, the source and drain electrodes of each of the TFTs T1 through T6 may be formed of polysilicon that is selectively doped. However, the one or more embodiments of the present invention are not limited thereto, and thus, in another embodiment, respective source and drain electrodes of a TFT may be formed from respective layers different from a semiconductor layer, and may be connected to respective source and drain regions of the semiconductor layer via respective contact holes.

Figure 6:
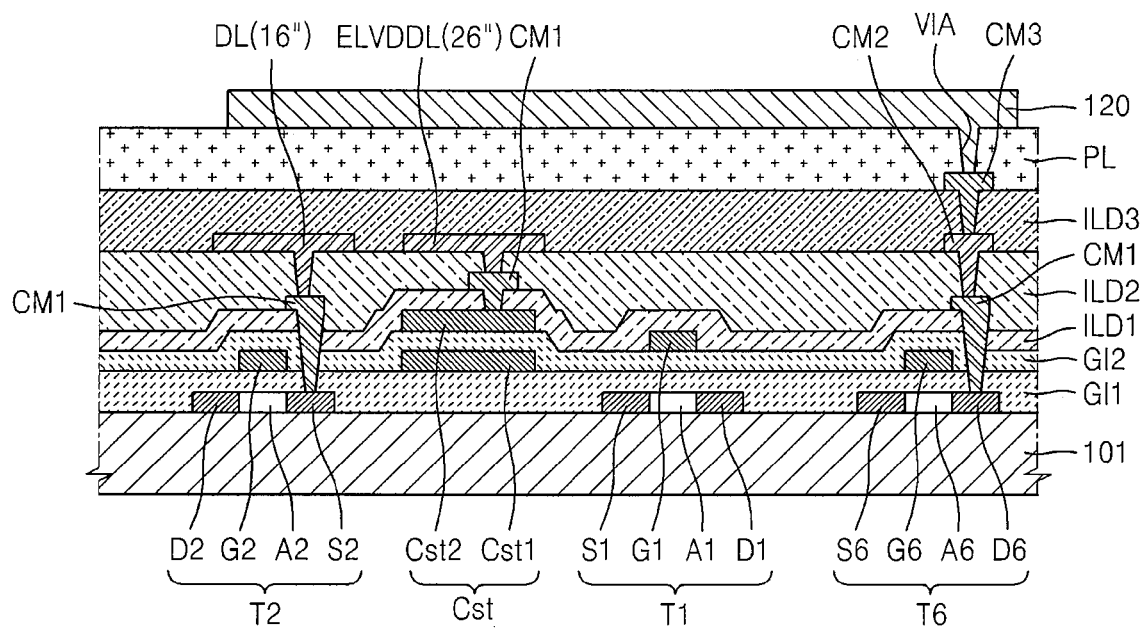
FIG. 6 is a cross-sectional view of a comparative example for comparison with the embodiment of the present invention shown in FIG. 5.

FIG. 6 is a cross-sectional view of a comparative example for comparison with the embodiment shown in FIG. 5.

The comparative example of FIG. 6 is different from the embodiment of FIG. 5 in that a data line 16" and a driving voltage line 26" are formed on the same layer, and a storage capacitor Cst overlaps with the driving voltage line 26" but does not overlap with the data line 16". Thus, the comparative example of FIG. 6 will be described in consideration of its different features from the embodiment of FIG. 5.

As in the comparative example of FIG. 6, when the driving voltage line 26" overlaps with the storage capacitor Cst, coupling (e.g., inductive or capacitive coupling) is incurred between the data line 16" and the storage capacitor Cst, such that crosstalk occurs. Thus, the storage capacitor Cst is formed not to overlap with the data line 16". However, when the storage capacitor Cst does not overlap with the data line 16", it is difficult to assure sufficient capacitance of the storage capacitor Cst. Also, since the data line 16" and the driving voltage line 26" are formed on the same layer, it is difficult to assure a sufficient amount space between lines, so that the driving voltage line 26" would not be formed as a horizontal line, thus making it difficult to realize a mesh structure, and thus making crosstalk due to a voltage drop of a first power voltage ELVDD possible.

On the other hand, according to the present embodiment shown in FIG. 5, the data line 16 and the driving voltage line 26 are formed on different layers, and the driving voltage line 26 is located between the data line 16 and the storage capacitor Cst. Accordingly, the driving voltage line 26 may be connected to pixels that are adjacent each other in the row direction (i.e., the second direction), and thus may be formed in a mesh structure. Thus, due to the driving voltage line 26 of the mesh structure, the voltage drop of the first power voltage ELVDD may be reduced or prevented. Also, since the horizontal line HL of the driving voltage line 26 has an area that completely covers the storage capacitor Cst, the horizontal line HL may shield the storage capacitor Cst against the data line 16, so that coupling between the data line 16 and the storage capacitor Cst may be reduced or prevented, and sufficient capacitance of the storage capacitor Cst may be assured.

According to the one or more embodiments of the present invention, since a data line and a driving voltage line are stacked, a capacitor may be located to overlap with the data line, so that coupling between the data line and the capacitor may be reduced or prevented, and the capacitance of the capacitor may be assured.

While embodiments of the present invention have been particularly shown and described with reference to exemplary embodiments thereof, it will be understood by those of ordinary skill in the art that various changes in form and details may be made therein without departing from the spirit and scope of the present invention as defined by the following claims, and their equivalents.

What is claimed is:

1. A thin film transistor array substrate comprising a plurality of pixels, each of the pixels comprising:
    a capacitor comprising a first electrode, and a second electrode located above the first electrode;
    a data line extending in a first direction, configured to provide a data signal, located above the capacitor, and overlapping a part of the capacitor; and
    a driving voltage line configured to supply a driving voltage, located between the capacitor and the data line, and comprising a first line extending in the first direction, and a second line extending in a second direction substantially perpendicular to the first direction.

2. The thin film transistor array substrate of claim 1, wherein the second electrode of the capacitor is electrically coupled to the driving voltage line via a contact hole.

3. The thin film transistor array substrate of claim 1, wherein the driving voltage line has a mesh structure.

4. The thin film transistor array substrate of claim 1, wherein the first line of the driving voltage line is coupled to ones of the pixels that are adjacent each other in the first direction, and
   wherein the second line of the driving voltage line is coupled to ones of the pixels that are adjacent each other in the second direction.

5. The thin film transistor array substrate of claim 1, wherein the second line of the driving voltage line completely covers the capacitor.

6. The thin film transistor array substrate of claim 1, further comprising:
   a first interlayer insulating layer and a second interlayer insulating layer stacked between the capacitor and the driving voltage line; and
   a third interlayer insulating layer between the driving voltage line and the data line.

7. The thin film transistor array substrate of claim 1, wherein each of the plurality of pixels further comprises:
   a driving thin film transistor (TFT) electrically coupled between the driving voltage line and a light-emitting device; and
   a switching TFT electrically coupled between the data line and the driving TFT.

8. The thin film transistor array substrate of claim 7, wherein the driving TFT comprises:
   a semiconductor layer;
   a gate electrode coupled to the first electrode of the capacitor and located above the semiconductor layer at a same layer as the second electrode of the capacitor;
   a source electrode electrically coupled to the driving voltage line; and
   a drain electrode electrically coupled to the light-emitting device.

9. The thin film transistor array substrate of claim 7, wherein the switching TFT comprises:
   a semiconductor layer;
   a gate electrode located above the semiconductor layer at a same layer as the first electrode of the capacitor, and coupled to a first scan line extending in the second direction;
   a source electrode coupled to the data line; and
   a drain electrode coupled to the driving TFT.

10. The thin film transistor array substrate of claim 1, wherein each of the plurality of pixels further comprises:
    a first scan line, a second scan line, and an emission control line extending in the second direction at a same layer as the first electrode of the capacitor; and
    an initialization voltage line extending in the second direction between the driving voltage line and the second electrode of the capacitor.

11. An organic light-emitting display apparatus comprising a plurality of pixels each comprising:
    a capacitor comprising a first electrode and a second electrode above the first electrode;
    a data line configured to provide a data signal and located above, and overlapping a part of, the capacitor, the data line extending in a first direction; and
    a driving voltage line located between the capacitor and the data line and configured to supply a driving voltage, the driving voltage line comprising a first line extending in the first direction, and a second line extending in a second direction substantially perpendicular to the first direction.

12. The organic light-emitting display apparatus of claim 11, wherein the second electrode of the capacitor is electrically coupled to the driving voltage line via a contact hole.

13. The organic light-emitting display apparatus of claim 11, wherein the driving voltage line has a mesh structure.

14. The organic light-emitting display apparatus of claim 11, wherein the first line of the driving voltage line is coupled to ones of the pixels that are adjacent each other in the first direction, and
    wherein the second line of the driving voltage line is coupled to ones of the pixels that are adjacent each other in the second direction.

15. The organic light-emitting display apparatus of claim 11, wherein the second line of the driving voltage line completely covers the capacitor.

16. The organic light-emitting display apparatus of claim 11, further comprising:
    a first interlayer insulating layer and a second interlayer insulating layer stacked between the capacitor and the driving voltage line; and
    a third interlayer insulating layer between the driving voltage line and the data line.

17. The organic light-emitting display apparatus of claim 11, further comprising a first TFT electrically coupled between the driving voltage line and a light-emitting device, and
    a second TFT coupled between the data line and the first TFT.

18. The organic light-emitting display apparatus of claim 17, wherein the first TFT further comprises:
    a semiconductor layer;
    a source electrode electrically coupled to the driving voltage line; and
    a drain electrode electrically coupled to the light-emitting device,
    wherein a gate electrode of the first TFT is located above the semiconductor layer at a same layer as the second electrode of the capacitor, and is coupled to the first electrode of the capacitor.

19. The organic light-emitting display apparatus of claim 17, wherein the second TFT further comprises:
    a semiconductor layer;
    a source electrode coupled to the data line; and
    a drain electrode coupled to the first TFT,
    wherein a gate electrode of the second TFT is located above the semiconductor layer at a same layer as the first electrode of the capacitor, and is coupled to a first scan line that extends in the second direction.

20. The organic light-emitting display apparatus of claim 11, wherein each of the plurality of pixels further comprises:
    a first scan line, a second scan line, and an emission control line extending in the second direction and located at a same layer as the first electrode of the capacitor; and
    an initialization voltage line extending in the second direction and located between the second electrode of the capacitor and the driving voltage line.

* * * * *